United States Patent [19]

Tanaka et al.

[11] Patent Number: 5,172,468
[45] Date of Patent: Dec. 22, 1992

[54] MOUNTING APPARATUS FOR ELECTRONIC PARTS

[75] Inventors: Satoru Tanaka, Kanagawa; Kazuhide Tago, Tokyo, both of Japan

[73] Assignee: Sony Corporation, Tokyo, Japan

[21] Appl. No.: 745,705

[22] Filed: Aug. 16, 1991

[30] Foreign Application Priority Data

Aug. 22, 1990 [JP] Japan .................................. 2-220840
Nov. 20, 1990 [JP] Japan .................................. 2-314864

[51] Int. Cl.$^5$ .............................................. H05K 3/30
[52] U.S. Cl. ...................................... 29/721; 29/740; 29/743; 29/833
[58] Field of Search ............... 29/720, 721, 740, 743, 29/705, 714–719, 833

[56] References Cited

U.S. PATENT DOCUMENTS 4,608,494 8/1986 Kobayashi et al. .............. 250/461.1

FOREIGN PATENT DOCUMENTS 449481 10/1991 European Pat. Off. .

OTHER PUBLICATIONS

IBM technical disclosure bulletin vol. 31, No. 12, May 1989, entitled "Closed-Loop Surface Mount Device Imaging System".

Primary Examiner—Carl E. Hall
Attorney, Agent, or Firm—Lewis H. Eslinger; Jay H. Maioli

[57] ABSTRACT

An electronic part mounting apparatus enables reduction of the time required for attracting and mounting of a part and is reduced in cost and occupies comparatively little space as composed to conventional electronic part mounting apparatus. The mounting apparatus comprises a mounting head, an attracting nozzle mounted for vertical movement, an image pickup camera mounted in parallel to the attracting nozzle, and a mirror unit mounted for horizontal movement and including a plurality of reflecting mirrors disposed in opposing relationship to lower ends of the attracting nozzle and camera to define a light path from an electronic part attracted to the part attracting nozzle to the camera. When the attracting nozzle operates to attract or mount an electronic part, the mirror unit is moved horizontally away from a position below the attracting nozzle, but when an image of the electronic part is to be picked up by the camera, the mirror unit is positioned just below the attracting nozzle to establish the light path.

3 Claims, 10 Drawing Sheets

F I G. 2
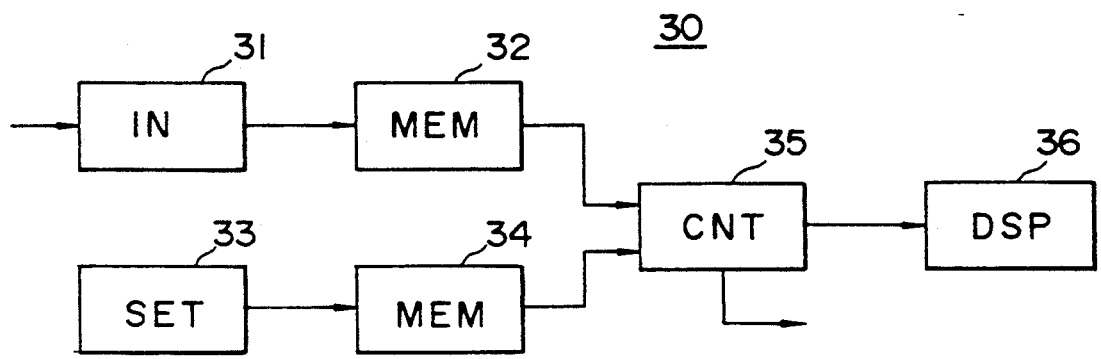
F I G. 3
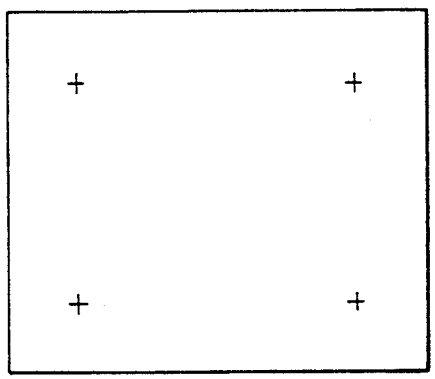
F I G. 4
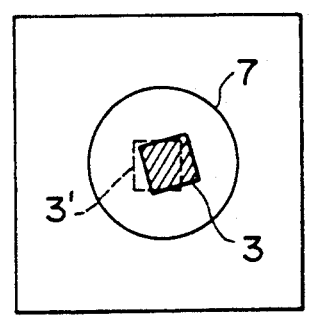
F I G. 5
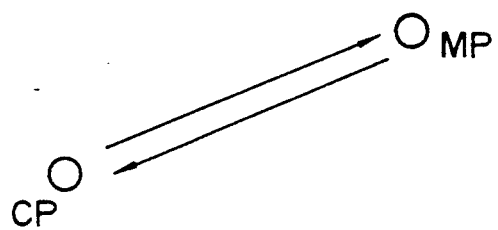

F I G. 12
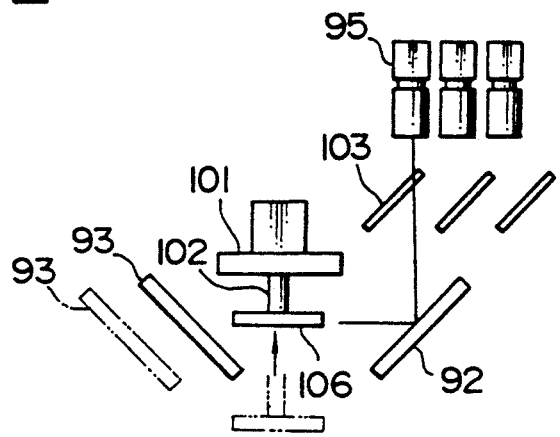
F I G. 13
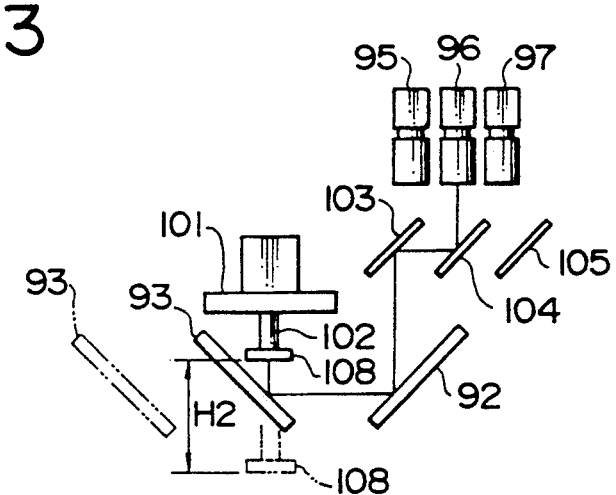
F I G. 14
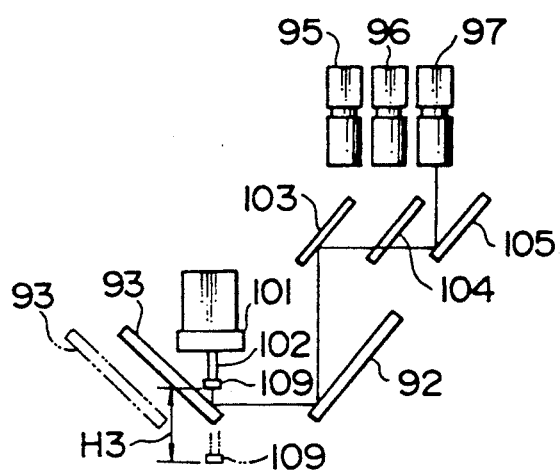

MOUNTING APPARATUS FOR ELECTRONIC PARTS

BACKGROUND OF THE INVENTION

1. Field of the Invention

This invention relates to an electronic part mounting apparatus for mounting electronic parts at predetermined positions of a printed circuit board, and more particularly to an apparatus for picture processing and identifying an attracted condition of an electronic part attracted to a vacuum attracting nozzle and a position of such electronic part placed on a printed circuit board.

2. Descritption of the Prior Art

In the field of automatic assembly of printed circuit boards, an electronic part mounting apparatus is employed to mount or place an electronic part such as an IC (integrated circuit) device, a small capacitor or a resistor at a predetermined position of a printed circuit board. An electronic part mounting apparatus is constituted so that two layers of a double tape in which electronic parts are accommodated are exfoliated from each other to take out an electronic part and then the thus taken out electronic part is moved to and placed at a predetermined position of a printed circuit board on which the electronic part is to be mounted.

In order to mount an electronic part accurately at a predetermined position of a printed circuit board, an accurate position of the printed circuit board must be identified, and in order to mount to electronic part accurately at the predetermined position including its orientation, a condition of the electronic part in which it is attracted by a vacuum attracting nozzle must be identified. As for the latter identification, for example, for an IC device, if the IC device is not in an intended attracted position or orientation, then leads of the IC device cannot be placed regularly on lands of the printed circuit board. Therefore, an attracted condition of the IC device is identified, and the position and/or orientation of the IC device are adjusted to mount the IC device onto the printed circuit board.

Referring to FIG. 6A, identification of a position of a printed circuit board is illustratively shown. An electronic part mounting apparatus for mounting an electronic part includes a head in which an attracting nozzle 7 for attracting an electronic part thereto by vacuum is provided. An electronic part attracting section 8 on which the attracting nozzle 7 is supported, a camera 60 and a lens 62 having a fixed magification are also provided in the head of the electronic part mounting apparatus. The head is moved to a position above a printed circuit board 1 placed at a fixed location of the electronic part mounting apparatus, and a reference position of the printed circuit board 1 is inputted to a signal processing apparatus not shown by way of the camera 60 through the fixed magnification lens 62. Such input data are picture processed by the signal processing apparatus to detect an accurate position of the printed circuit board at which an electronic part is to be mounted. Further, referring to FIG. 6B, at a fixed position at which another camera 64 and another fixed magnification lens 66 are disposed, an attracted condition of an electronic part 3 in which it is attracted to the attracting nozzle 7 is inputted to the signal processing apparatus by way of the camera 64 through the fixed magnification lens 66 and then picture processed to identify such attracted condition of the electronic part 3. While such identification of a position of a printed circuit board as illustrated in FIG. 6A is performed once, such identification of an attracted condition of an electronic part as illustrated in FIG. 6B is performed a plurality of times for individual electronic parts.

Referring now to FIG. 7, there is illustrated a route of movement of the head to which an electronic part is attracted. The movable head on which the attracting nozzle 7, electronic part attracting section 8, camera 60 and lens 62 are carried is first moved to a part attracting position CP, at which an electronic part 3 is attracted to the attracting nozzle 7 by vacuum. Then, the head is moved to a picture image processing position IP for which the camera 64 is disposed. Then, an attracted condition of the electronic part 3 is identified from below as illustrated in FIG. 6B. Afterwards, the movable head is moved to a part mounting position MP for a printed circuit board, and then the electronic part 3 is released from vacuum attraction to the attracting nozzle 7 and mounted at a predetermined position of the printed circuit board.

The camera 64 and fixed magnification lens 66 shown in FIG. 6B will be described more in detail. Referring now to FIG. 8, in order to assure accurate identification in accordance with a size of an electronic part to be identified, preferably three fixed magnification lenses 81 to 83 having different fixed magnifications are disposed in front of cameras 85 to 87, respectively, and an attracted condition of an electronic part 8 is inputted by way of the cameras 85 to 87 through half mirrors 71 to 73. Thus, most appropriate video data in connection with the magnifications of the fixed magnification lenses 81 to 83 are used to identify the attracted condition of the electronic part.

Since the camera 64 for identifying an attracted condition of an electronic part is disposed at the picture image processing position IP as shown in FIGS. 6B and 7, the movable head is moved, for each electronic part attracting and mounting operation, along the route including the part attracting postion CP, picture image processing position IP and part mounting position MP. Accordingly, the movable head moves over a comparatively long distance since it moves from and to the picture image processing position IP outside a portion of the route of movement of the head between the other two positions CP and MP. Besides, since accurate positioning at the picture image processing IP is required, a comparatively long time is required for attracting and mounting of an electronic part, and accordingly, the working efficiency is low.

Further, the camera 64 and fixed magnification lens 66 disposed at the fixed position for identifying an electronic part from below as illustrated in FIG. 6B must be provided in addition to the camera 60 and fixed magnification lens 62 carried on the movable head for identifying a printed circuit board from above as illustrated in FIG. 6A, which requires a correspondingly high cost of equipment. Further, while the signal processing apparatus is used commonly for the cameras 60 and 64 disposed at a next stage, common signal processing accuracy cannot be achieved due to a small difference in accuracy between the camera 60 and fixed magnification lens 66 and the camera 64 and fixed magnification lens 66, and besides an operation for adjusting or eliminating such difference is required.

Further, if a plurality of systems of such half mirrors 71 to 73, fixed magnification lenses 81 to 83 and cameras 85 to 87 as shown in FIG. 8 are provided in order to obtain an optimum picture image, then a corresponding high cost of equipment is required, and besides an installation spacing for them may restrict installation of some other parts or may limit movement of the head.

SUMMARY OF THE INVENTION

It is an object of the present invention to provide an electronic part mounting apparatus wherein a time required for attracting and mounting operations of an electronic part is reduced comparing with a conventional electronic part mounting apparatus.

It is another object of the present invention to provide an electronic part mounting apparatus which is simplified in construction and reduced in cost and requires a comparatively small spacing.

It is a further object of the present invention to provide an electronic part mounting apparatus which is high in accuracy in indentification of an electronic part and a printed circuit board in position and orientation.

In order to attain the objects, according to an aspect of the present invention, there is provided a mounting apparatus for mounting an electronic part, which comprises a mounting head, a part attracting nozzle mounted for movement in a vertical direction on the mounting head for attracting thereto an electronic part to be mounted, an image pickup camera mounted in parallel to the part attracting nozzle on the mounting head, and a mirror unit mounted for movement in a horizontal plane on the mounting head and including a plurality of reflecting mirrors disposed in opposing relationship to a lower end of the part attracting nozzle and a lower end of the camera to define a light passageway along which an image of an electronic part attracted to the part attracting nozzle is transmitted to the camera, wherein the mirror unit is moved, when the part attracting nozzle operates to attract an electronic part thereto and also to mount the thus attracted electronic part, horizontally away from a position below the lower end of the part attracting nozzle, but when an image of an electronic part attracted to the part attracting nozzle is to be picked up by the camera, the mirror unit is positioned just below the lower end of the part attracting nozzle to establish the light passageway.

With the mounting apparatus for mounting an electronic part, an attracted condition of an electronic part attracted to the part attracting nozzle is detected by way of the image pickup camera to which an image of the electronic part is transmitted by way of the mirror unit which is positioned, when such image picking up operation is performed, to establish the light passageway from the electronic part to the image pickup camera. Accordingly, such an additional camera for detecting an attracted condition of an electronic part as is provided at the picture image processing position IP in the conventional electronic part mounting apparatus described hereinabove with reference to FIGS. 6A to 8 need not be provided. Consequently, a cost of equipment can be reduced and an installation spacing can be reduced. Further, since no such special position as the picture image processing position IP is provided, the part attracting nozzle may be directly moved between an electronic part attracting position and and electronic part mounting position, and consequently, a time required for mounting an electronic part can be reduced. Besides, since the mirror unit is moved horizontally away from the position below the lower end of the part attracting nozzle when an operation of the attracting nozzle to attract an electronic part thereto or to mount such electronic part, it will not interfere with such operation of the attracting nozzle.

Preferably, the mounting head is mounted on horizontally moving means for moving the mounting head in a horizontal plane, and when the mounting head is moved in the horizontal plane by the horizontal moving means after an electronic part is attracted to the part attracting nozzle, an image of the electronic part is picked up by the camera while the mirror is operated at the same time. With the electronic part mounting apparatus, since pickup of an image of an electronic part is performed during movement of the mounting head, a time required for mounting an electronic part can be further reduced.

The mirror unit may further include another plurality of reflecting mirrors disposed so as to define another passageway of light to the camera to reflect to the camera a reference position mark on a circuit board onto which an electronic part is to be mounted. With the electronic part mounting apparatus, since detection of a position of an electronic part mounting member such as a printed circuit board onto which an electronic part is to be mounted is performed commonly by way of the single image pickup camera, a possible error in accuracy in positional detection which arises, where two or more different cameras are employed, from a difference in accuracy between them is eliminated.

Preferably, the image pickup camera includes a lens system having a variable magnification so that an optimum picture image may be obtained by focusing thereof.

According to another aspect of the present invention, there is provided an electronic part mounting apparatus wherein an electronic part is attracted and an attracted condition of the electronic part is identified, and then the position of the electronic part is corrected in accordance with a result of such identification and then the electronic part is mounted at a predetermined location, wherein an electronic part mounting mechanism is moved directly between an electronic part attracting position and an electronic part mounting position and carries thereon a camera, a fixed mirror, a movable mirror which is disposed for movement in an opposing relationship to the fixed mirror, a nozzle for attracting an electronic part thereto, a rotating and lifting mechanism for rotating and vertically moving the nozzle and a mechanism for moving the mirror such that a predetermined passageway of light may be defined by the camera, fixed mirror and movable mirror, and when the nozzle is being moved toward the electronic part mounting position after an electronic part has been attracted thereto, the rotating and lifting mechanism and the movable mirror moving mechanism cooperate with each other to move the movable mirror and also move the attracting nozzle upwardly to a vertical position which varies in accordance with a size of the electronic part attracted to the attracting nozzle and at which an attracted condition of the electronic part to the attracting nozzle is identified with the camera and the position of the electronic part is corrected before another position at which the attracting nozzle collides with the mirror is reached.

With the electronic part mounting apparatus, since the attracting nozzle is moved up to an optimum position in accordance with a size of an electronic part attracted thereto, a time required for such lifting movement is minimized.

The above and other objects, features and advantages of the present invention will become apparent from the following description and the appended claims, taken in conjunction with the accompanying drawings in which like parts or elements are denoted by like reference characters.

BRIEF DESCRIPTION OF THE DRAWINGS

FIG. 2 is a block diagram of a signal processing apparatus of the electronic part mounting apparatus of FIG. 1A;

FIG. 3 is a diagrammatic view illustrating picture image data of reference positions on a printed circuit board;

FIG. 4 is a diagrammatic view illustrating picture image data of an electronic part;

FIG. 5 is an illustration showing a route of movement of an electronic part by the electronic part mounting apparatus of FIG. 1A;

FIG. 12 is a similar view but illustrating identification of a sidewardly attracted condition of an electronic part on the electronic part mounting apparatus of FIG. 9;

FIGS. 13 and 14 are similar views illustrating alternative manners of such identification at such a stage as shown in FIG. 11B;

DETAILED DESCRIPTION OF THE PREFERRED EMBODIMENTS

Figure 1A:
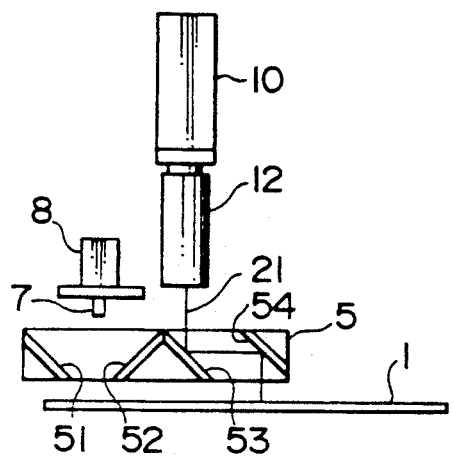
FIGS. 1A, 1B, 1C and 1D are schematic elevational views of an electronic part mounting apparatus at different operative positions showing a preferred embodiment of the present invention.

Referring first to FIGS. 1A to 1D, there is shown an electronic part mounting apparatus to which the present invention is applied. The electronic part mounting apparatus shown includes a movable head on which a mirror unit 5, an electronic part attracting section 8 including an attracting nozzle 7, a camera 10 and a zoom lens 12 are carried. Though not shown, the movable head further has carried thereon a servomotor for moving the mirror unit 5 in a rightward direction R or a leftward direction L on a pair of rails mounted on the movable head, another servomotor for moving the electronic part attracting section 8 in an upward direction U or a downward direction D, and a further servomotor for moving the zoom lens 12 upwardly or downwardly. Also the movable head is driven to move by a still further servomotor not shown, and a position of the movable head is detected by means of an encoder not shown.

Figure 1B:
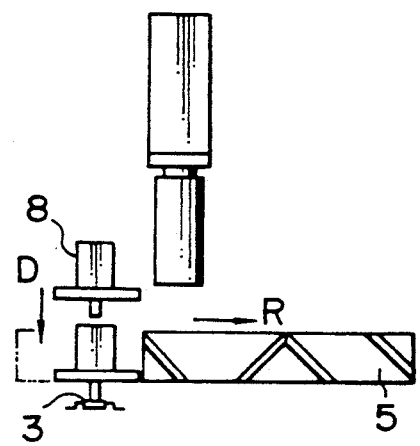
Figure 1C:
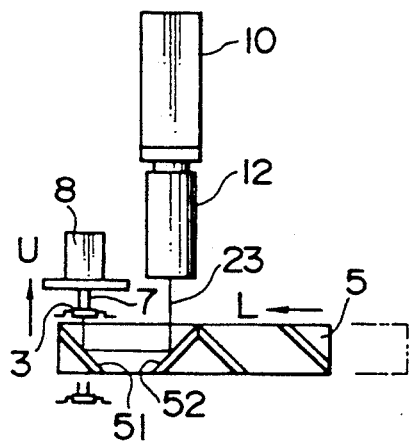
Figure 1D:
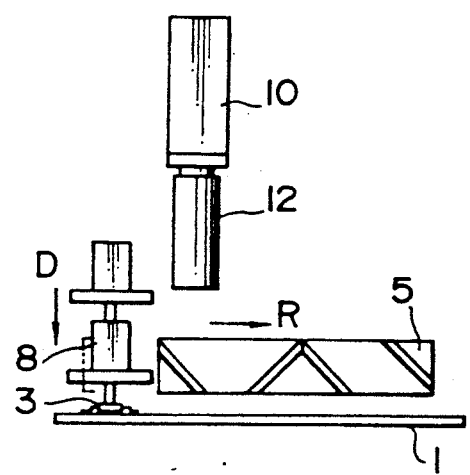
Figure 6A:
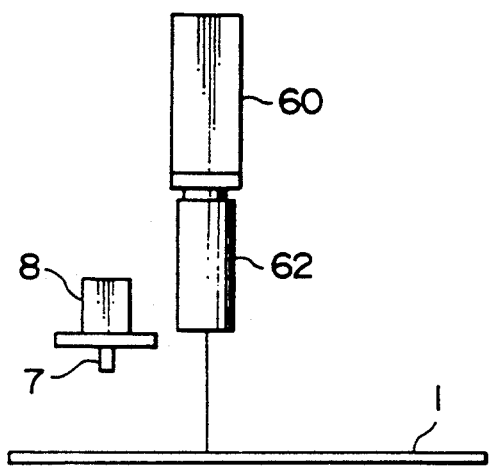
FIGS. 6A and 6B are schematic elevational views illustrating conventional identification of a reference position of a printed circuit board and attraction of an electronic part, respectively.
Figure 6B:
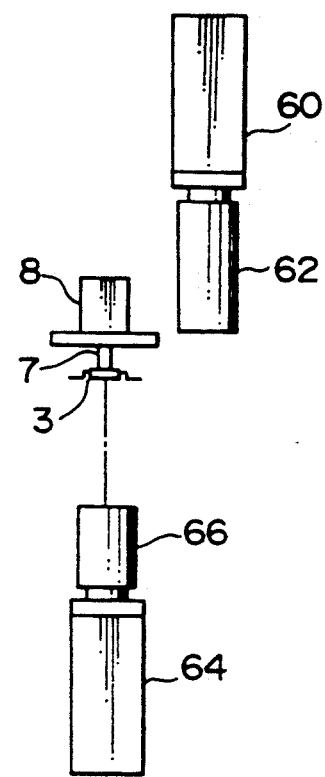
Figure 7:
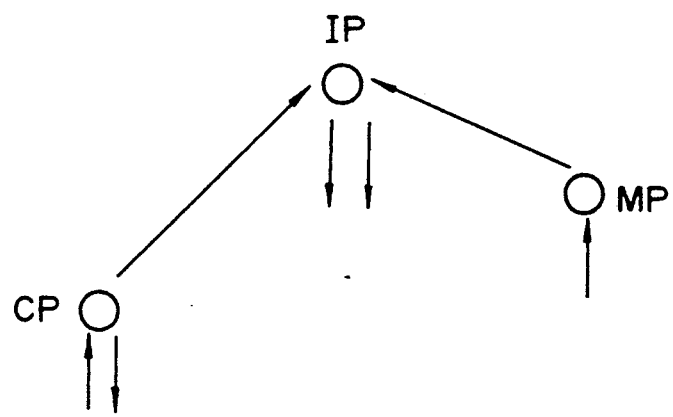
FIG. 7 is an illustration showing a route of movement of an electronic part on a conventional electronic part mounting apparatus.
Figure 8:
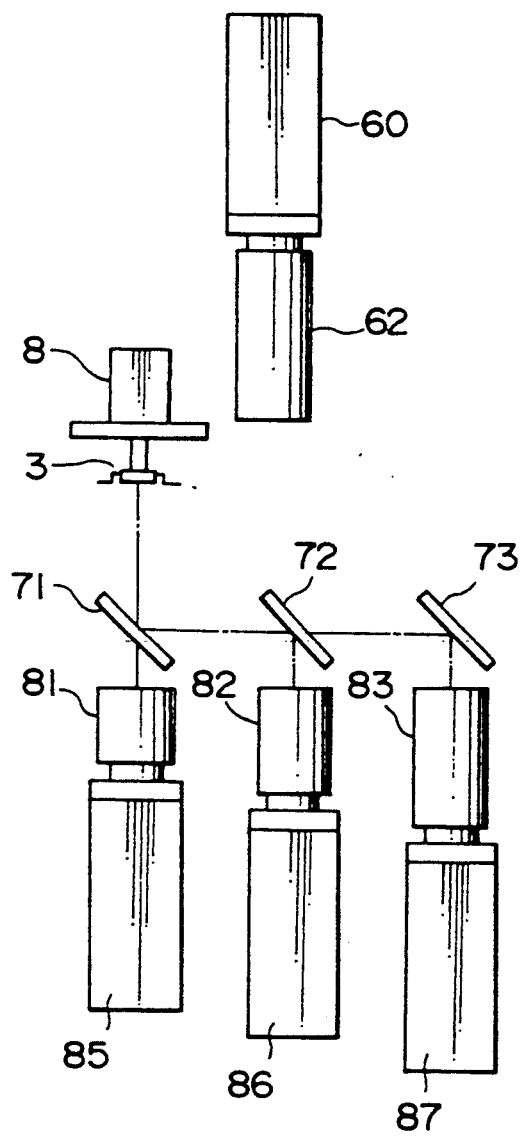
FIG. 8 is a schematic elevational view showing a conventional arrangement of electronic part mounting identifying cameras.

The mirror unit 5 includes a first mirror 51, a second mirror 52, a third mirror 53 and a fourth mirror 54 disposed in such a manner as seen in FIGS. 1A to 1D therein. The third and fourth mirrors 53 and 54 are disposed such that they may form such a light passageway 21 as seen in FIG. 1A between the camera 10 and a printed circuit board 1 disposed at a fixed position below the mirror unit 5. Meanwhile, the first and second mirrors 51 and 52 are disposed so that they form such another light passageway 23 as seen in FIG. 1C between the camera 10 and an electronic part 3 attracted to the attracting nozzle 7 located above the mirror unit 5. Since the mirror unit 5 is constructed in such a manner as described above, an attracted condition of the electronic condition 3 and a reference position of the printed circuit board 1 can be detected.

The camera 10 here is a CCD (charge coupled device) camera, and video data (picture image data) of the camera 10 are inputted to a signal processing apparatus 30 shown in FIG. 2. Referring to FIG. 2, the signal processing apparatus 30 includes an input unit 31 for receiving video data from the camera 10, a memory 32 for storing therein video data received by the input unit 31, a data setting unit 33 for setting data therethrough, another memory 34 for storing therein data set by the data setting unit 33, an identifying and controlling unit 35 for reading video data and set data from the memories 32 and 32, respectively, and a display unit 36 for displaying thereon a signal received from the identifying and controlling unit 35.

In the electronic part mounting apparatus, a reference mark of a printed circuit board 1 is detected to detect an accurate position of the printed circuit board 1 placed on the fixed location of the apparatus. In particular, referring to FIG. 1A, the movable head is moved to a position above a printed circuit board 1 as an electronic part mounting member placed at the fixed location of the electronic part mounting apparatus. The printed circuit board 1 has four reference marks such as "+" for identification of a position thereof applied to a surface thereof as seen in FIG. 3. The camera 10 is moved so that the reference marks of the printed circuit board 1 may be successively detected by the camera 10 carried on the movable head through the zoom lens 12 which has a magnification adjusted to a predetermined value by a zoom lens driving servomotor (not shown) in response to a controlling instruction from the identifying and controlling unit 35. A video signal from the camera 10 is stored into the memory 32 by way of the input unit 31. Data corresponding to the reference marks of the printed circuit board 1 are stored in advance in the memory 34 by way of the data setting unit 33. The identifying and controlling unit 35 compares the picture image data stored in the memory 32 with the data stored in the memory 34 and controls the movable head to move so that the two data coincide with each other. When the picture image data stored in the memory 32 coincide with the data stored in the memory 34, a value of the encoder then is inputted and a position of the printed circuit board 1 placed on the fixed location is detected accurately. Then, the reference marks inputted by way of the camera 10 and the reference marks stored by way of the data setting unit 33 are displayed on the display unit 36 so that their relationship may be visually observed therefrom.

On the electronic part mounting apparatus described above, electronic part attracting and mounting operations proceed in such a manner as described below. In particular, the movable head is moved between a part attracting position CP and a part mounting position MP as illustrated in FIG. 5, and an attracted condition of an electronic part 3 is identified on a route of such movement of the movable head.

More particularly, after the movable head is positioned at the part attracting position CP as seen in FIG. 1B, the mirror unit 5 is moved in the rightward direction in FIG. 1B by the mirror unit driving servomotor. Consequently, the electronic part attracting section 8 is enabled to be moved in the downward direction D. Thus, the electronic part attracting section 8 is moved in the downward direction D by the electronic part attracting section driving servomotor to attract an electronic part 3 placed at a predetermined location to the attracting nozzle 7 at an end of the electronic part attracting section 8.

Then, the attracting nozzle 7 and the electronic part attracting section 8 to which the electronic part 3 is attracted are moved in the upward direction U by the electronic part attracting section driving servomotor as seen in FIG. 1C. Afterwards, the mirror unit 5 is moved in the leftward direction L by the mirror unit driving servomotor. Consequently, a light path 23 is formed between the electronic part 3 and the camera 10 so that an attracted condition of the electronic part 3 attracted to the end of the attracting nozzle 7 is inputted as a picture image signal from the camera 10 into the input unit 31. The picture image signal is stored into the memory 32. Then, the zoom lens driving servomotor is controlled to adjust the magnification of the zoom lens 12 by the identifying and controlling unit 35 so that an optimum focal condition may be reached.

It is to be noted that, at a time at when the electronic part attracting section 8 is returned to its original position shown in FIG. 1C, the movable head is moved toward the part mounting position MP.

During such movement, an attracted condition of the electronic part 3 is identified by the signal processing apparatus 30. A regular attracted condition of a specific electronic part is stored into the memory 34 by way of the data setting unit 33, and the identifying and controlling unit 35 compares attracted condition data of the picture image data from the camera 10 stored in the memory 32 with the regular electronic part attracted condition data stored in the memory 34. Then, if there is some difference between the attracted conditions, the difference between them is calculated. The attracted condition stored in the memory 32 and the difference are displayed on the display unit 36 as shown in FIG. 4. FIG. 4 illustrates the attracted electronic part 3 and picture image data of the attracting nozzle 7 around the electronic part 3, and a broken line 3 indicates such regular electronic part attracted condition as described above.

After the movable head is moved to a position above the printed circuit board 1, the mirror unit 5 is moved in the rightward direction R by the mirror unit driving servomotor in response to a controlling instruction of the identifying and controlling unit 35 so that the attracting nozzle 7 to which the electronic part 3 is attracted is enabled to be moved in the downward direction D. Such movement of the mirror unit 5 in the rightward direction R may otherwise be performed during movement of the movable head toward the mounting position MP.

When the identifying and controlling unit 35 determines from a result of identification of an attracted condition of the electronic part 3 that angular correction and positional correction are required, it executes positional or angular correction of the electronic part attracting section 8 so that the electronic part 3 may be positioned accurately at a predetermined mounting position of the printed circuit board 1. Afterwards, the electronic part 3 is released from attraction by the attracting nozzle 7 and thus mounted at the predetermined accurate position of the printed circuit board 1.

Later, the movable head is moved back from the mounting position MP to the attracting position CP. Then, such sequence of operations as described hereinabove with reference to FIGS. 1B and 1D will be repeated for a required number of electronic parts to be mounted.

Figure 9:
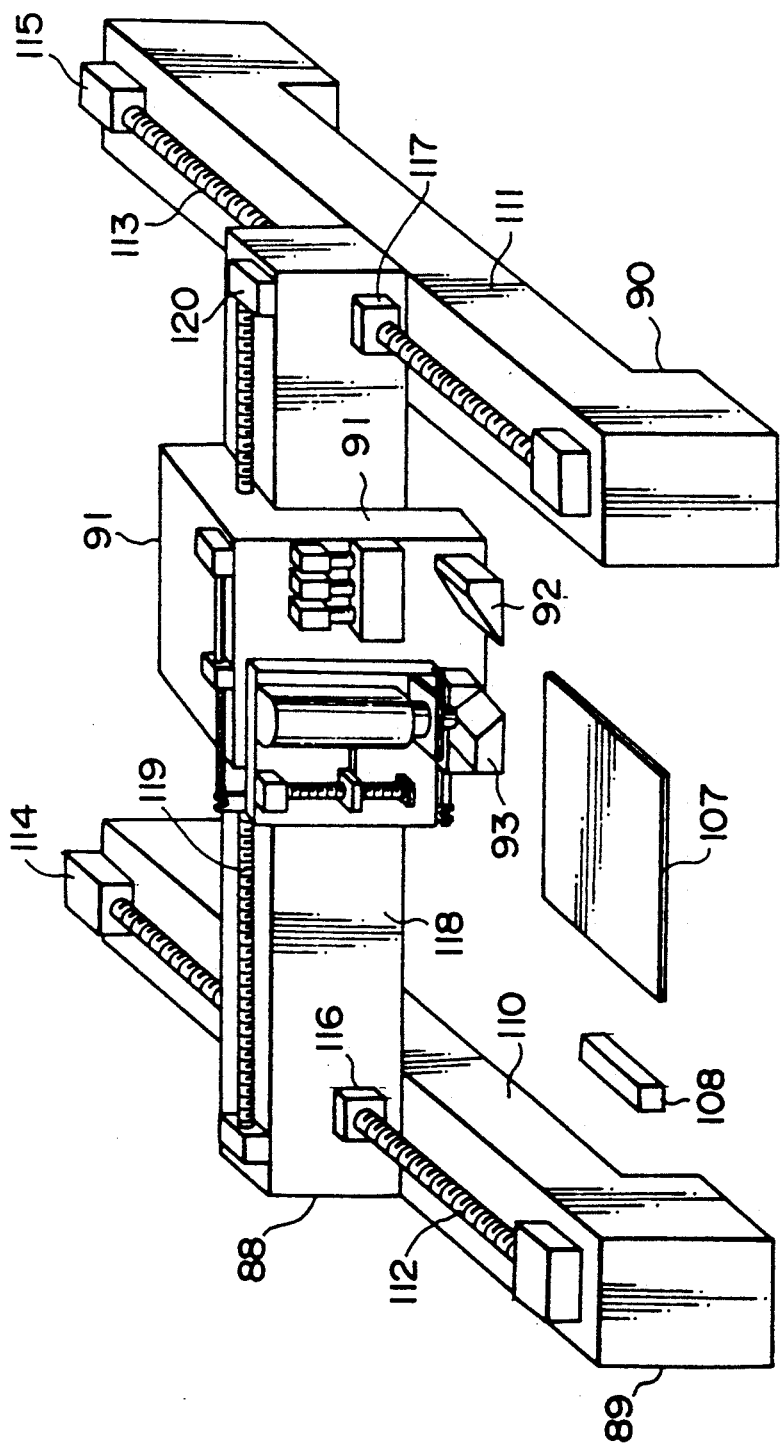
FIG. 9 is a perspective view of another electronic part mounting apparatus showing a second preferred embodiment of the present invention.

Referring now to FIG. 9, there is shown another electronic part mounting apparatus to which the present invention is applied. The present electronic part mounting apparatus includes an X-axis moving mechanism 88 and a pair of Y-axis moving mechanisms 89 and 90. An electronic part mounting mechanism 91 is mounted on the X-axis moving mechanism 88 so that it is moved in an X-axis direction of the X-axis moving mechanism 88. The X-axis moving mechanism 88 is moved in a perpendicular Y-axis direction along the Y-axis moving mechanisms 89 and 90.

In particular, the Y-axis moving mechanisms 89 and 90 include a pair of beams 110 and 111 disposed in parallel to each other, a pair of feed screws 112 and 113 and a pair of driving motors 114 and 115 mounted on the beams 110 and 111, respectively, and a movable beam 118 having a pair of feed nuts 116 and 117 provided thereon and held in engagement with the feed screws 112 and 113, respectively. The X-axis moving mechanism 88 includes a feed screw 119 mounted at the top of the movable beam 118 and a servomotor 120 also mounted at the top of the movable beam 118 and connected to drive the feed screw 119 to rotate. The electronic part mounting mechanism 91 is held in engagement with the feed screw 119 so that it can be moved in an X-axis direction by rotation of the feed screw 119.

Figure 10:
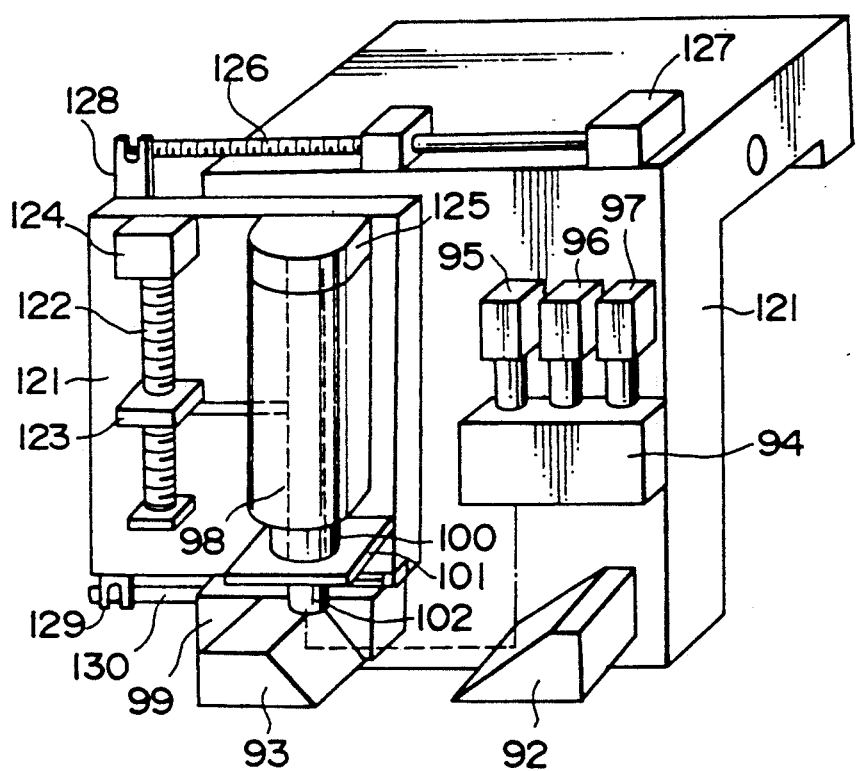
FIG. 10 is an enlarged perspective view of the electronic part mounting apparatus of FIG. 9.

Referring now to FIG. 10, the electronic part mounting mechanism 91 is shown more in detail. The electronic part mounting mechanism 91 carries thereon a fixed mirror 92, a movable mirror 93, a half mirror block 94, first to third cameras 95, 96 and 97, a rotating, vertically moving and attracting mechanism 98 and a movable mirror moving mechanism 99 for moving the movable mirror 93 in a horizontal direction H. The rotating, vertically moving and attracting mechanism 98 has a rotating section 100 provided at a lower portion thereof and rotates the rotating section 100 in a direction indicated by an arrow mark R. The rotating, vertically moving and attracting mechanism 98 also moves the rotating section 100 upwardly or downwardly in a Z-axis direction, that is, in a vertical direction. Also a reflecting plate 101 and an attracting nozzle 102 are rotated or moved upwardly or downwardly in response to rotation or upward or downward movement of the rotating section 100. The rotating, vertically moving and attracting mechanism 98 further has a vacuum attracting mechanism so that it may attract an electronic part thereto by way of an attracting nozzle 102.

In particular, the rotating, vertically moving and attracting mechanism 98 is connected to a feed nut 123 of a driving mechanism which includes a feed screw 122, the feed nut 123 and a driving servomotor 124 all provided on a movable block 121 so that it may be moved upwardly or downwardly by the driving mechanism. The rotating, vertically moving and attracting mechanism 98 is also connected to another servomotor 125 located thereabove on the movable block 121 so that it may be driven to rotate by the servomotor 125. Meanwhile, the movable mirror 93 is driven by a driving mechanism 99 which is integrated therewith and mounted for sliding movement at a lower end portion of the movable block 121. The movable mirror driving mechanism 99 is connected by way of a connecting bar 130 to an end 129 of a linkage lever 128 which is mounted for leftward and rightward movement on the movable block 121. The linkage lever 128 is connected at the other end thereof to a feed screw 126 mounted at the top of the movable block 121 and connected to a servomotor 127 also mounted at the top of the movable block 121. Thus, as the servomotor 127 rotates, the movable mirror 93 is moved in a horizontal direction H.

Figure 11A:
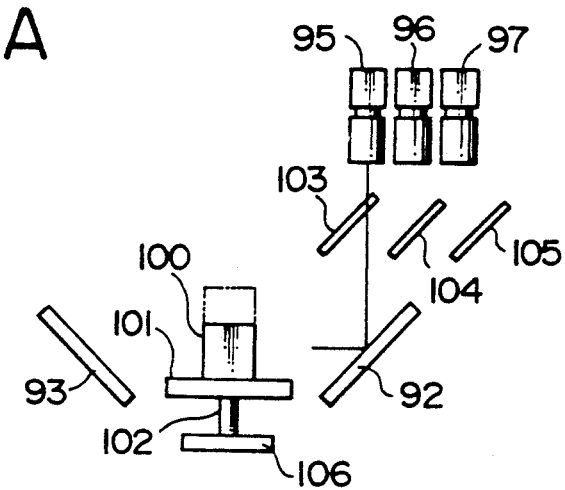
FIGS. 11A, 11B and 11C are diagrammatic representations illustrating different stages of operation of the electronic part mounting apparatus of FIG. 9.

The half mirror block 94 includes first to third half mirrors 103, 104 and 105 as shown in FIG. 11A. The half mirrors 103, 104 and 105 transmit therethrough a video image from the fixed mirror 92 to the cameras 95, 96 and 97 thereabove, and the first half mirror 103 reflects such video image to the second and third half mirrors 104 and 105.

A positional relationship of the fixed mirror 92, movable mirror 93, attracting nozzle 102, reflecting mirror 101, rotating section 100, first to third half mirrors 103 to 105 and first to third cameras 95 to 97 is shown in FIG. 11A. The first to third cameras 95, 96 and 97 have different magnifications which are set to suitable values so that an attracted condition of an electronic part attracted to the attracting nozzle 102 may be identified in accordance with a size thereof from a picture image.

Figure 15:
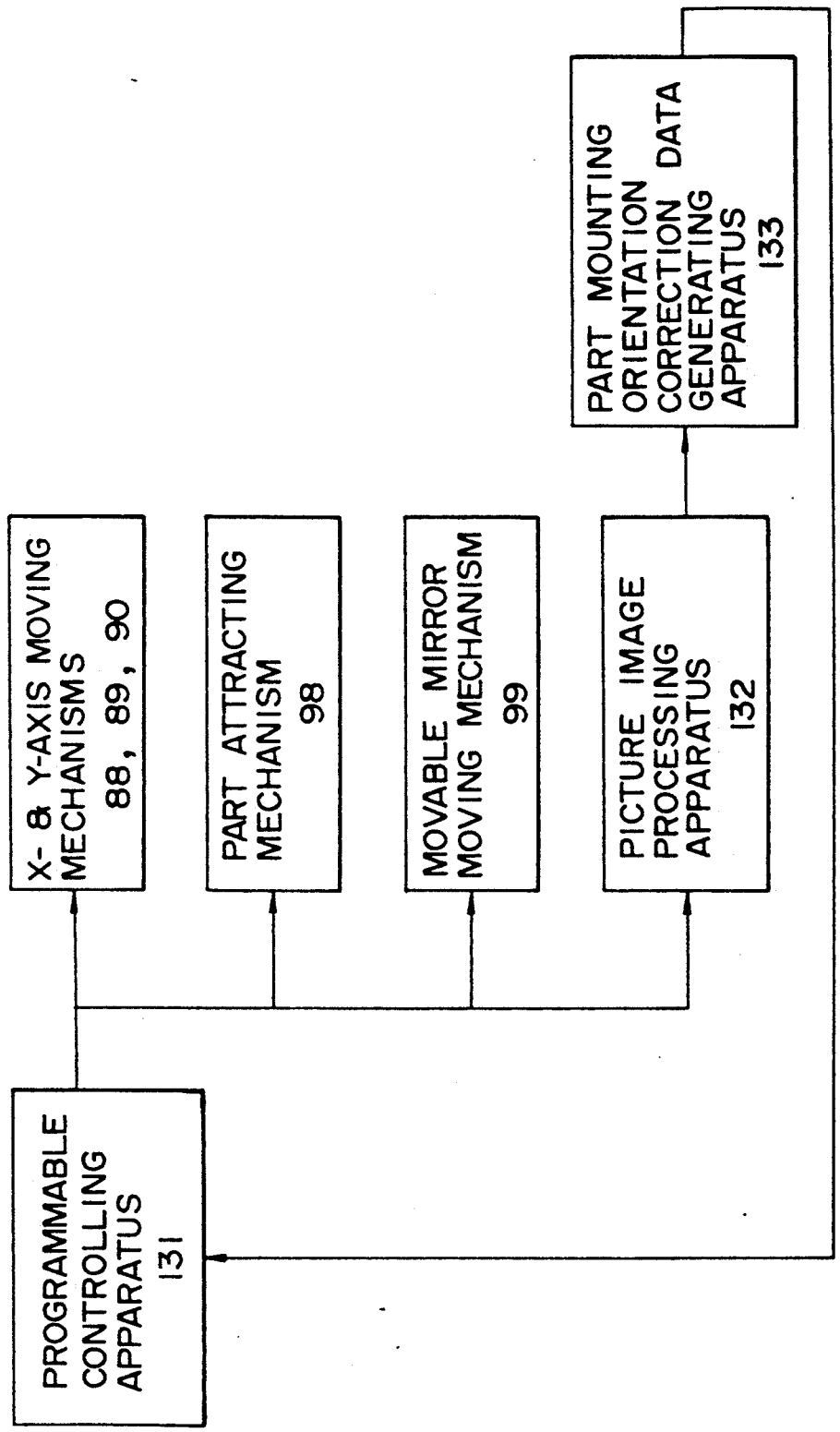
FIG. 15 is a block diagram showing a controlling system for the electronic part mounting apparatus shown in FIG. 9.

The electronic part mounting apparatus is controlled by a controlling system shown in block diagram in FIG. 15. Referring to FIG. 15, the servomotors 114, 115, 120, 124, 125 and 127 of the X- and Y-axis moving mechanisms 88, 89 and 90, rotating, vertically moving and attracting mechanism 98 and movable mirror moving mechanism 99 and a picture image processing apparatus 132 are connected to a programmable controlling apparatus 131 so that they may be controlled by the latter. Data of a type and a quantity of parts to be mounted, locations of parts to be mounted, a mounting orientation and so forth are inputted to the programmable control apparatus 131 by way of suitable inputting means not shown while part mounting orientation correction data are fed back from a part mounting angle correction data generating apparatus 133 connected to the picture image processing apparatus 132 so as to control the rotating, vertically moving and attracting mechanism 98.

Figure 11B:
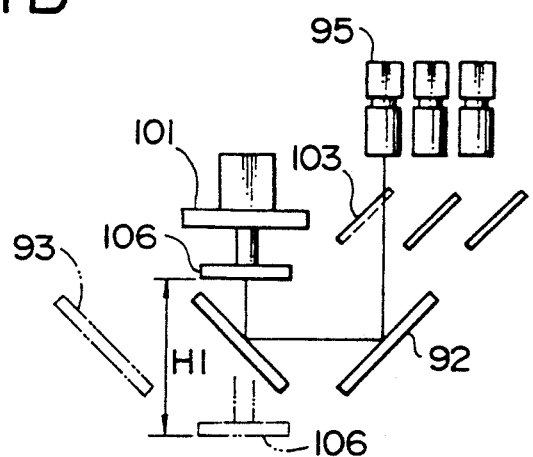
Figure 11C:
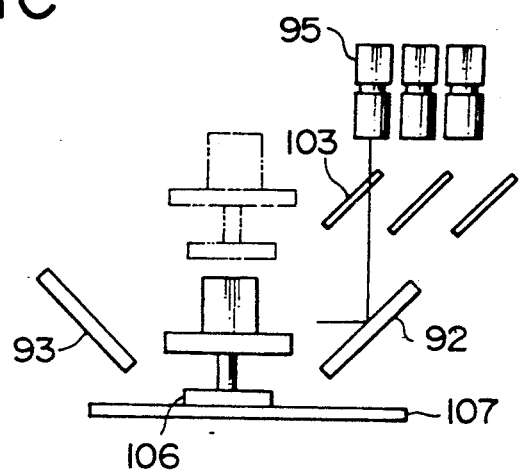

FIGS. 11A to 11C show different steps of a procedure of mounting an electronic part 106 of a comparatively large size onto a printed circuit board 107 by the electronic part mounting apparatus described above. When the large size electronic part 106 is to be mounted by the attracting nozzle 102, first the X-axis moving mechanism 88 is positioned by the Y-axis moving mechanisms 89 and 90, and then the electronic part mounting mechanism 91 is positioned in the X-axis direction by the X-axis moving mechanism 98. Consequently, the attracting nozzle 102 carried on the electronic part mounting mechanism 91 is positioned in the X- and Y-axis directions of the electronic part receiving station 108 on which the electronic part 106 to be mounted is placed.

After the attracting nozzle 102 is positioned in the X- and Y-axis directions, it is moved to a position of the electronic part 106 on the electronic part receiving station 108 by the rotating, vertically moving and attracting mechanism 98 and attracts the large size electronic part 106 thereto by vacuum as shown in FIG. 11A.

After the attracting nozzle 102 attracts the large size electronic part 106 thereto, it starts to be moved to a mounting position of the printed circuit board 107 by movement of the electronic part mounting mechanism 91 in the X-axis direction and movement of the X-axis moving mechanism 98 in the Y-axis direction.

During such transportation of the large size electronic part 106 after the electronic part 106 is attracted by vacuum to the attracting nozzle 102 as described above, the movable mirror 93 is moved in the rightward direction in FIG. 11B while the attracting nozzle 102 is moved upwardly by a distance H1 as illustrated in FIG. 11B. Such movement of the movable mirror 93 is performed in order to prevent the same from colliding inadvertently with the electronic part 106 attracted to the attracting nozzle 102.

So upward movement of the attracting nozzle 102 is judged such that the large size electronic part 106 attracted to the attracting nozzle 102 is recognized by way of the first half mirror 103 and first camera 95 in such a manner as seen in FIG. 12. In particular, the attracting nozzle 102 to which the large size electronic part 106 is attracted is moved upwardly by the rotating, vertically moving and attracting mechanism 98 from a position wherein it is not recognized by the first camera 95 to another position wherein it is recognized by the first camera 95. At the lifted position, an attracted condition of the electronic part 106 in a sideward direction, that is, an attracted condition of the electronic part 106 as viewed in a horizontal direction, is identified by a picture image processing section not shown in accordance with picture image data produced from the camera 95.

After the large size electronic part 106 is moved upwardly further to a position at which an attracted condition thereof can be recognized sufficiently in a vertical direction, such upward movement is stopped.

After upward movement of the attracting nozzle 102 is stopped, an accurate attracted condition of the large size electronic part 106 is identified by the first camera 95 by way of the first half mirror 103. In this instance, identification of an attracted condition of the large size electronic part 106 is performed by way of the optical system of the movable mirror 93, fixed mirror 92, first half mirror 103 and first camera 95. Identifying processing itself of such attracted condition is executed by the picture image processing section not shown in a similar manner as in a conventional electronic part mounting apparatus.

After such identification of an attracted condition of the large size electronic part 106, the movable mirror 93 is retracted to its original position indicated by a broken line in FIG. 12 by the movable mirror moving mechanism 99.

Figure 16:
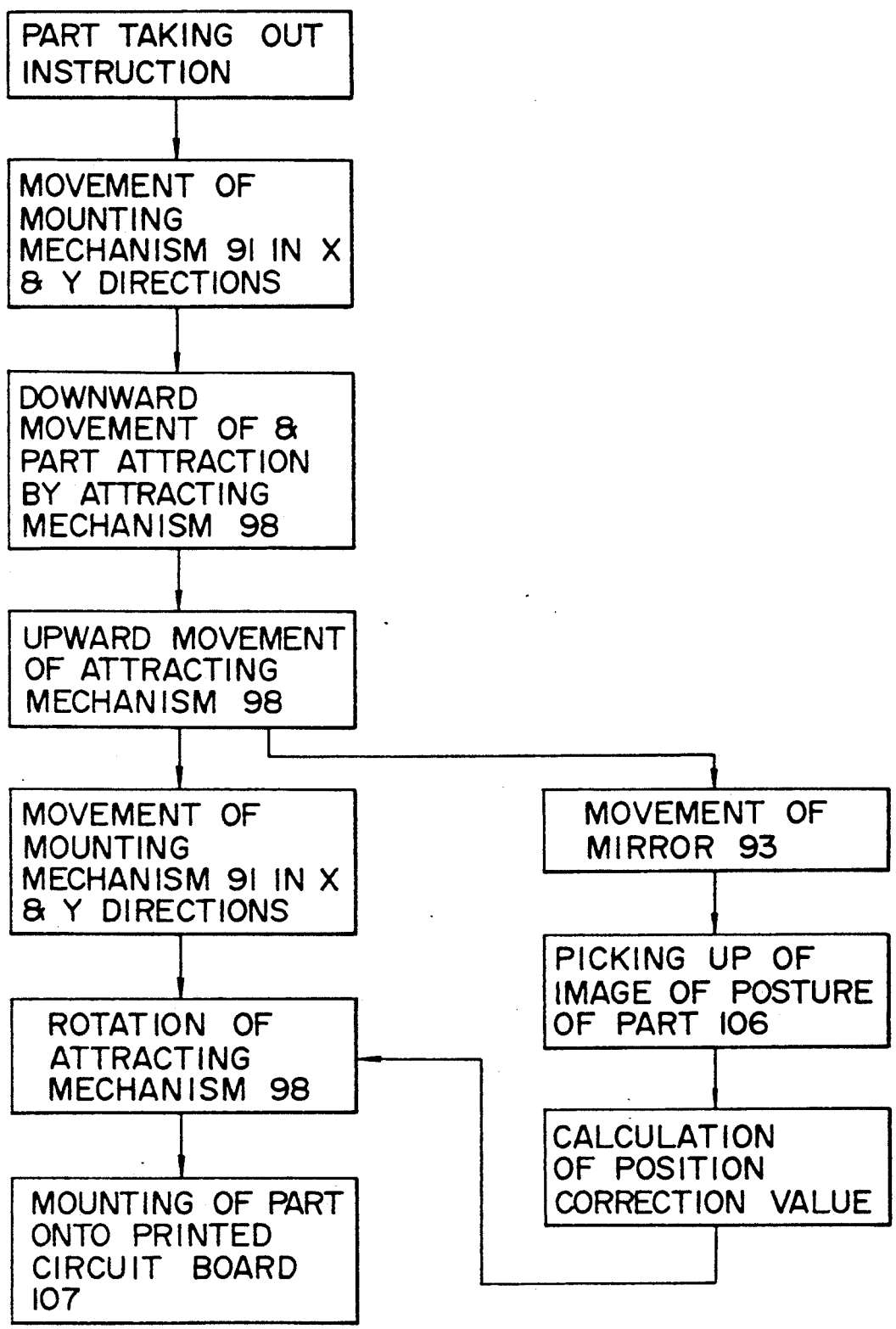
FIG. 16 is a flow chart illustrating a part mounting process executed by the controlling system shown in FIG. 15.

In this manner, upward movement of the attracting nozzle 102, movement of the movable mirror 93 and identification of an attracted condition of the large size electronic part 106 are performed while the attracting nozzle 102 to which the large size electronic part 106 is attracted is moved to the mounting position of the printed circuit board 107 by movement of the electronic part mounting mechanism 91 in the X-axis direction and movement of the X-axis moving mechanism 88 in the Y-axis direction as illustrated in FIG. 16. Accordingly, an attracted condition of the large size electronic part 106 is identified in the process of movement of the large size electronic part 106, and consequently, a time required for transportation of the large size electronic part 106 can be reduced.

Identification of the large electronic part 106 is performed in the process of transportation of the same to the printed circuit board 107 in this manner, and if it is determined necessary to adjust the mounted position of the large size electronic part 106, then the rotating section 100 is rotated suitably by the rotating, vertically moving and attracting mechanism 98.

After the attracting nozzle 102 to which the large size electronic part 106 is attracted is moved down to a position just above the mounting position of the printed circuit board 107, the large size electronic part 106 is placed at the mounting position of the printed circuit board 107 as shown in FIG. 11C. In particular, the attracting nozzle 102 is moved down by the rotating, vertically moving and attracting mechanism 98 until the large size electronic part 106 is contacted with the mounting position of the printed circuit board 107, and then attraction of the large size electronic part 106 is cancelled. Consequently, the large size electronic part 106 is mounted onto the predetermined position of the printed circuit board 107.

After the large size electronic part 106 is mounted onto the printed circuit board 107, the attracting nozzle 102 is moved upwardly by the rotating, vertically moving and attracting mechanism 98, and then the electronic part mounting mechanism 91 and the X-axis moving mechanism 98 are driven again to move the attracting nozzle 102 to the electronic part receiving station 108.

Another electronic part 108 of a medium size or a further electronic part 109 of a small size is mounted in a similar manner as in the case of mounting of the large size electronic part 106. In such an instance, however, the lifted position for identification of an attracted condition of an electronic part is different depending upon a size of the electronic part. In particular, when the medium size electronic part 108 is to be mounted, it is moved up, as shown in FIG. 13, by a distance H2 smaller than the distance H1 by which the large size electronic part 106 is lifted, but when the small size electronic part 109 is to be mounted, it is moved up, as shown in FIG. 14, by a distance H3 further smaller than the distance H2. Such lifted position of the medium size electronic part 108 or small size electronic part 109 is detected by the second half mirror 104, second camera 96 and picture image processing section not shown as seen in FIG. 13 or by the third half mirror 105, third camera 97 and picture image processing section as seen in FIG. 14. In short, identification of an attracted condition of the medium size electronic part 108 is performed by the second camera 96 while identification of an attracted condition of the small size electronic part 109 is performed by the third camera 97. To this end, the first, second and third half mirrors 103, 104 and 105 are each constituted from a semi-transmitting half mirror.

It is to be noted that FIGS. 13 and 14 show the electronic part mounting apparatus at the position shown in FIG. 11B.

Since the position at which an electronic part attracted to the attracting nozzle 102 collides with the movable mirror 93 depending upon a size of the electronic part as apparent from the foregoing description, the attracting nozzle 102 is moved up to a lowest vertical position at which an electronic part attracted thereto does not collide with the movable mirror 93.

The picture image processing section for controlling such operation of the electronic part mounting apparatus and identifying an attracted condition of an electronic part may be realized, for example, with a microcomputer. Thus, control of a position of the X-axis moving mechanism 88, control of positions of the Y-axis moving mechanisms 89 and 90, control of rotation, upward and downward movement and attraction of the rotating, vertically moving and attracting mechanism 98, control of movement of the movable mirror moving mechanism 99, detection of a lifted position of an electronic part, identification of an attracted condition of an electronic part and adjustment of a rotational position of an electronic part which is executed when necessary are executed by the microcomputer.

While the electronic part mounting apparatus described above involves attraction of an electronic part by vacuum, an electronic part may otherwise be attracted by magnetism or else be gripped mechanically. Thus, according to the present invention, "attraction" includes not only attraction by vacuum and magnetic attraction but also mechanical gripping and some other mechanical attraction.

Having now fully described the invention, it will be apparent to one of ordinary skill in the art that many changes and modifications can be made thereto without departing from the spirit and scope of the invention as set forth herein.

What is claimed is:

1. In a mounting apparatus for mounting an electronic part on a circuit board, the improvement which comprises a mounting head, a part attracting nozzle mounted for movement in a vertical direction on said mounting head for attracting thereto an electronic part to be mounted on said circuit board, image pickup camera means mounted in parallel to said part attracting nozzle on said mounting head, and a mirror unit mounted for horizontal movement between at least first and second horizontal positions and including a plurality of reflecting mirrors disposed in opposing relationship to a lower end of said part attracting nozzle and a lower end of said camera means, wherein first and second reflecting mirrors of said plurality in said first horizontal position of said mirror unit define a first light path along which an image of a reference mark on said circuit board is transmitted to said camera means and wherein third and fourth reflecting mirrors of said plurality in said second horizontal position of said mirror unit define a second light path along which an image of an electronic part attached to said part attracting nozzle is transmitted to said camera means, wherein said mirror unit is moved to said first horizontal position when said part attracting nozzle operates to attract an electronic part thereto and also to mount the thus attached electronic part on said circuit board.

2. A mounting apparatus according to claim 1 wherein said image pickup camera means includes a lens system having a variable magnification.

3. In an electronic part mounting apparatus wherein an electronic part is attracted and an attracted condition of the electronic part is identified, and then the position of the electronic part is corrected in accordance with a result of such identification and then the electronic part is mounted at a predetermined location, the improvement which comprises an electronic part mounting mechanism, camera means, a fixed mirror, a movable mirror, a nozzle, a rotating and lifting mechanism, and a mechanism for moving said movable mirror, and wherein:

said electronic part mounting mechanism is movable between an electronic part attracting position and an electronic part mounting position and carries thereon said camera means, said fixed mirror, said movable mirror, said nozzle, said rotating and lifting mechanism and said mechanism for moving said movable mirror, said movable mirror is disposed for movement in an opposing relationship to said fixed mirror, said nozzle is adapted to attract an electronic part thereto, said rotating and lifting mechanism is adapted to rotate and vertically move said nozzle and said mechanism for moving said movable mirror so that a predetermined path of light is defined by said camera means, fixed mirror and movable mirror, and wherein:

when said nozzle is moved toward the electronic part mounting position after an electronic part has been attracted thereto, said rotating and lifting mechanism and said movable mirror moving mechanism cooperate with each other to move said movable mirror and also move said attracting nozzle upwardly to a vertical position which varies in accordance with a size of the electronic part attracted to said attracting nozzle and at which an attracted condition of the electronic part to said attracting nozzle is identified by said camera means and the position of the electronic part is corrected before said movable mirror and said attracting nozzle are moved to another position at which said attracting nozzle would otherwise collide with said movable mirror.

* * * * *